United States Patent [19]

Lee et al.

[11] Patent Number: 5,306,951
[45] Date of Patent: Apr. 26, 1994

[54] SIDEWALL SILICIDATION FOR IMPROVED RELIABILITY AND CONDUCTIVITY

[75] Inventors: Roger R. Lee; Fernando Gonzalez; Tyler A. Lowrey, all of Boise, Id.

[73] Assignee: Micron Technology, Inc., Boise, Id.

[21] Appl. No.: 883,008

[22] Filed: May 14, 1992

[51] Int. Cl.$^5$ .................. H01L 23/48; H01L 23/52; H01L 29/40
[52] U.S. Cl. .................. 257/755; 257/757; 257/761; 257/764; 257/768
[58] Field of Search .............. 257/412, 413, 620, 754, 257/755, 757, 761, 764, 768, 770, 763, 769, 296, 909, 910, 903

[56] References Cited

U.S. PATENT DOCUMENTS

| | | |
|---|---|---|
| 4,476,482 | 10/1984 | Scott et al. ............... 257/755 |
| 4,528,744 | 7/1985 | Shibata ................... 257/413 |
| 4,731,642 | 3/1988 | Katto et al. .............. 257/755 |
| 4,914,501 | 4/1990 | Rivoli et al. ............. 257/755 |
| 4,954,855 | 9/1990 | Mimura et al. ............ 257/412 |
| 4,967,259 | 10/1990 | Takagi ................... 257/620 |
| 4,999,690 | 3/1991 | Rodder ................... 257/768 |
| 5,057,902 | 10/1991 | Haskell .................. 257/755 |

Primary Examiner—William Mintel
Assistant Examiner—Steven Loke
Attorney, Agent, or Firm—Stanley N. Protigal

[57] ABSTRACT

A process and structure for improving the conductive capacity of a polycrystalline silicon (poly) structure, such as a bit line. The inventive process allows for the formation of a refractory metal silicide layer on the top and sidewalls of a poly structure, thereby increasing the conductive capacity. To form the titanium silicide layer over the poly feature, the refractory metal is sputtered on the poly, which reacts to form the refractory metal silicide. A second embodiment is described whereby an isotropic etch of the poly feature slopes the sidewalls; then, the refractory metal is sputtered onto the polycrystalline silicon. This allows for the formation of a thicker layer of refractory metal silicide on the sidewalls, thereby further increasing the conductive capacitance of the poly structure. Suggested refractory metals include titanium, cobalt, tungsten, and tantalum.

16 Claims, 3 Drawing Sheets

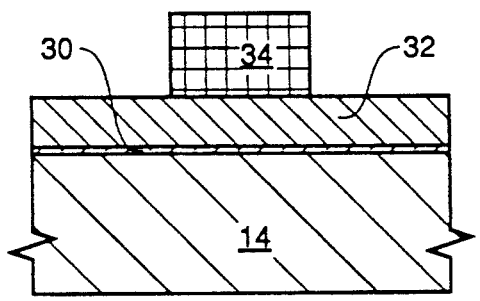
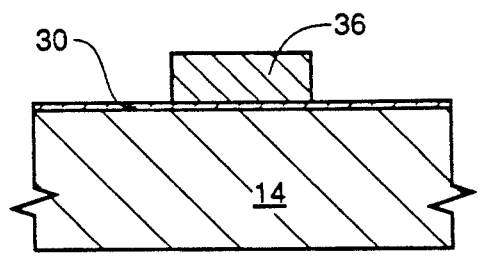
FIG. 2         FIG. 3
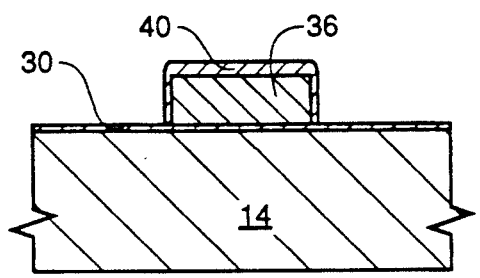
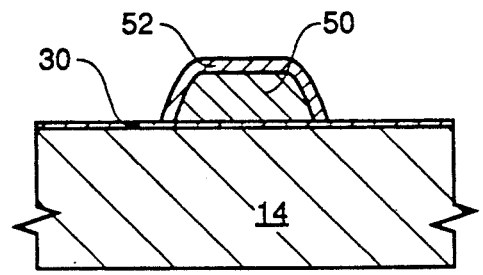
FIG. 4         FIG. 5

SIDEWALL SILICIDATION FOR IMPROVED RELIABILITY AND CONDUCTIVITY

FIELD OF THE INVENTION

This invention relates to the field of semiconductor manufacture. More specifically, a structure for increasing the conductivity and reliability of a conductive line formed from polycrystalline silicon is described.

BACKGROUND OF THE INVENTION

In the manufacture of semiconductor devices, the formation of conductive lines, for example, digit lines (bit lines) and word lines, is critical to produce a reliably functioning device. The structures, usually manufactured from a layer of polycrystalline silicon (poly), form an X-Y coordinate to select a single storage capacitor from an array.

As devices continue to increase in density, the features which form the various structures on the surface of the die decrease in size. Polycrystalline silicon is a material which is widely used to form the digit lines due to its conductive properties. As the devices increase in density, however, the decreasing width of the poly lines leaves a smaller volume of material to conduct a current, thereby making a read or a write to the capacitor which forms the storage node less reliable. As a result, data errors can occur.

One method which has been used to increase the conductive properties of the digit lines, transistor gates, and active areas on a random access memory, for example, is to use a material more conductive than the poly, such as titanium silicide, to increase the overall conductivity of the line. A typical structure comprising titanium silicide to increase conductance is shown in FIG. 1. To form a typical structure, the source 10 and drain 12 regions are formed in a substrate 14 of single crystal silicon, and the transistor gate 16 is formed over a layer of gate oxide 18. Oxide spacers 20 are then formed. Sputtered titanium reacts with the silicon, both polycrystalline 16 and doped monocrystalline 10, 12, to form a layer of titanium silicide 22A, 22B on the silicon gate 16 and active areas 10, 12. The oxide spacers 20 prevent titanium silicide 22B from forming on the poly gate sidewalls and shorting the poly gate 16 with the active areas 10, 12. Methods of semiconductor manufacture are described in "SILICON PROCESSING FOR THE VLSI ERA", by S. Wolf and R. N. Tauber, 1986, which is incorporated herein by reference.

The titanium silicide greatly increases the conductance of the active areas and the transistor gate. Titanium silicide is known to conduct electricity up to 50 times better than an equal amount of doped polycrystalline silicon.

A conductive line which is even more conductive than the titanium capped line described above would be desirable. This is especially true as devices continue to decrease in size and the conductivity of a polycrystalline silicon line becomes more difficult to maintain past a critical level because of a decreasing volume of material available through which to conduct a charge.

SUMMARY OF THE INVENTION

An object of the invention is to provide a conductive line which is more conductive than a strictly poly line or a poly line covered on one surface with a material comprising titanium.

This and other objects of the invention are realized by forming a conductive line of polycrystalline silicon which has a layer of a refractory metal silicide on three sides. Refractory metals, as used herein, include titanium, cobalt, tantalum, and tungsten. Titanium is chosen because it is believed the most conductive of the group, when applied by the described process. Since titanium is used as a preferred refractory metal, it is used to describe the invention throughout this document; however, any of the other refractory metals could also function sufficiently, depending on the application of the invention.

To form the inventive structure, an uncapped poly structure is first formed in accordance with means known in the art. For example, a blanket layer of poly is formed and a layer of photoresist is deposited over the poly layer. An etch removed the exposed poly, then the resist is removed to form a conductive poly line having substantially vertical sidewalls. Next, titanium is sputtered onto the top and sidewalls of the poly structure. The titanium reacts with the poly to form a layer of titanium silicide along the sidewalls of the poly structure and increases the conductive properties of the conductive line. The titanium can be sputtered on the vertical sidewalls by angling the sputter or tilting the wafer as it is being sputtered.

In a second embodiment, an isotropic etch is performed on the poly structure before the titanium is sputtered, thereby creating sloped poly sidewalls. A subsequent sputtering of titanium allows a greater thickness of titanium silicide on the sidewalls than does the sputtering upon substantially vertical sidewalls of the previous embodiment.

BRIEF DESCRIPTION OF THE DRAWINGS

FIG. 2 is a cross section of a first step in the formation of the inventive structure comprising a patterned layer of resist defining a polycrystalline silicon layer;

FIG. 3 is a cross section of the structure resulting from an etch and resist removal of the FIG. 2 structure;

FIG. 4 is a cross section of the FIG. 3 structure after sputtering of titanium to form a layer of titanium silicide over the polycrystalline silicon line;

FIG. 5 is a cross section of the FIG. 3 structure after an isotropic etch forms sloped sidewalls, and after titanium sputtering to create a layer of titanium silicide over the polycrystalline silicon structure;

DETAILED DESCRIPTION OF THE INVENTION

Figure 1:
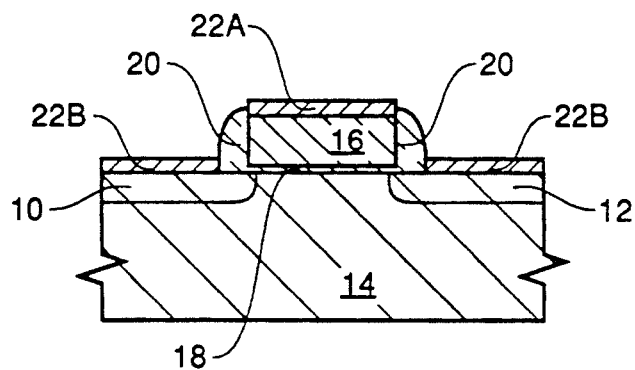
FIG. 1 is a cross section of a conventional gate structure having titanium silicide formed on the polycrystalline silicon gate and the monocrystalline silicon active areas.

FIGS. 2-4 show a method of forming a structure comprising titanium silicide on the side walls. In FIG. 2, a layer of dielectric 30, such as oxide, is formed over a substrate 14 of silicon or gallium arsenide. A blanket layer of polycrystalline silicon 32 is formed over the oxide layer 30, and a patterned layer of resist 34 defines what will be the poly line area. The poly is etched to form the poly structure 36 of FIG. 3. Next, titanium is sputtered onto the poly structure 36. It is known that the refractory metal does not react with the oxide 30, but reacts with the poly 36 to form titanium silicide. The sputtered titanium thereby forms a coat of titanium silicide 40 over the poly layer 36 as shown in FIG. 4. The titanium silicide layer 40 allows for a more conductive structure than poly alone or a titanium silicide capped poly feature as shown in FIG. 1.

A second embodiment of the invention begins with the structure of FIG. 3. After the rectangular poly structure 36 is formed, an isotropic etch of the polycrystalline silicon line forms a structure 50 having sloped sidewalls as shown in FIG. 5. An etch of a poly structure with a chlorine- or fluorine-based gas, or other material as known in the art, would sufficiently etch the poly structure 36. The sloped sidewalls allows a subsequent sputtering of titanium to form a thicker layer of titanium silicide 52, as shown in FIG. 5, than in the previously described embodiment as the slope of the sidewalls allows for more direct contact with the sputtered titanium. This allows an even greater improvement in the conductive capacity of the poly-titanium silicide structure than the embodiment having unsloped sidewalls.

Figure 6:
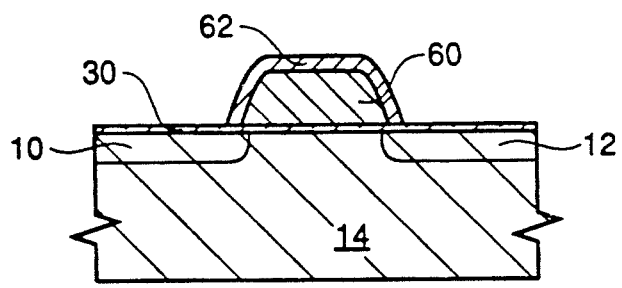
FIG. 6 is a cross section of a gate structure having the titanium silicide formed on three sides.

FIG. 6 shows a gate 60 structure having source 10 and drain 12 regions comprising the invention. In this embodiment, a layer of oxide 30 is formed over the substrate 14, and the polycrystalline gate structure 60 is formed by patterning a layer of poly and isotropically etching the poly as described above. The poly gate 60 is then sputtered with titanium to form titanium silicide 62 on the poly gate 60. The titanium does not react with the oxide. This embodiment purposely avoids siliciding the active area by leaving it covered with oxide 30. The oxide can have a thickness of from about 200 angstroms (Å) to about 2000 Å. A 200 Å thick layer of oxide is a fairly thin layer to prevent the passage of the titanium therethrough, and subsequent reaction with the underlying silicon 14, but would most likely be sufficient. A layer greater than 300 Å is recommended, however.

This inventive embodiment avoids the formation of spacers on the gate as described with FIG. 1. If the spacers were not formed in the FIG. 1 structure prior to sputtering, titanium silicide would be formed on the sidewalls thereby shorting the gate to the active area. The conventional method described by FIG. 1 teaches away from the instant invention, as formation of titanium silicide on the sidewalls is purposely avoided.

Figure 7A:
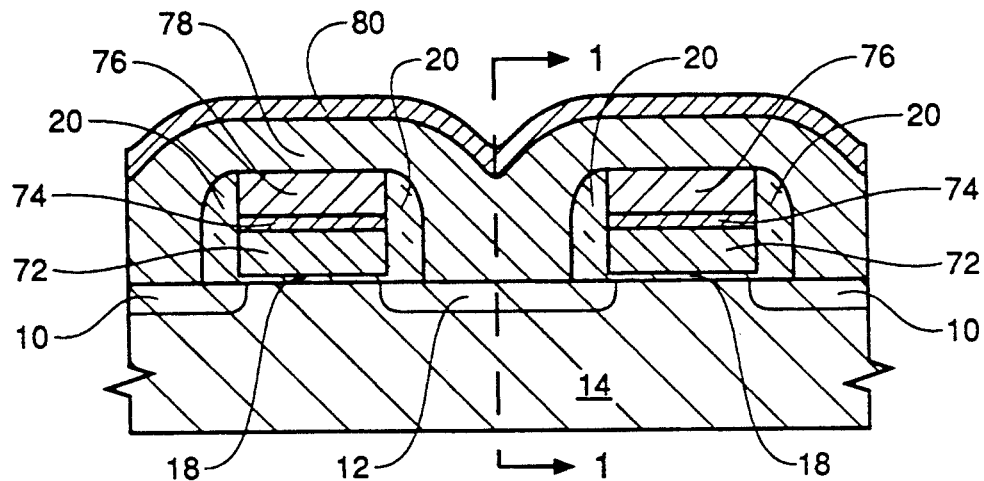
FIG. 7A is a cross section.
Figure 7B:
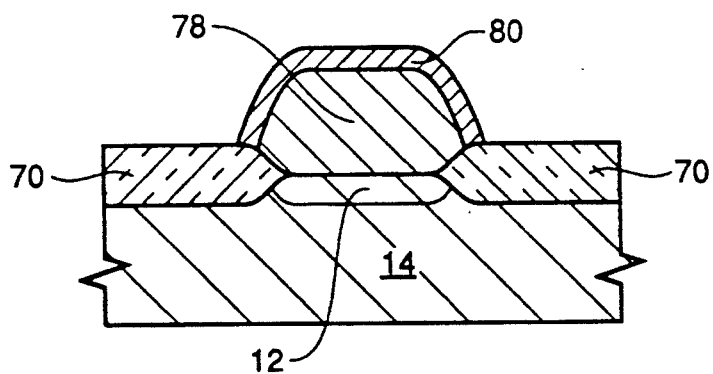
FIG. 7B is a cross section perpendicular to that of FIG. 7A, of a gate digit line having the titanium silicide formed on three layers.

Another application of the invention is shown in FIGS. 7A and 7B. In this application, source 10 and drain 12 regions are formed over a substrate 14, and regions of field oxide 70 and gate oxide 18 are formed. Oxide spacers 20 can also be formed by means known in the art. The transistor gate can be formed from layers of poly 72, tungsten silicide 74, and oxide 76 as shown, or other gate structures can be formed. In any case, a polycrystalline silicon digit line 78 is formed according to means known in the art, and the poly structure 78 is sputtered with titanium to form a layer of titanium silicide 80 over the structure, thereby increasing the conductive efficiency of the structure.

When used as a digit line, a 4000 Å thick digit line having a 1,500 Å layer of titanium silicide may be sufficient, depending on the technology used and the density of the device being manufactured. In many instances a poly:titanium silicide ratio of 3:1 is sufficient. However, the ratio can vary greatly depending on the use and application of the invention, and the 3:1 ratio is only a suggested ratio from which to begin for many applications of the invention.

Experimentation may show more advantageous ratios, depending on the application of the invention.

The invention becomes more useful as the feature sizes on the surface of a semiconductor device decrease. In previous technology, a digit line, for example, may have been 3 microns wide and 0.5 microns thick. In this instance, a titanium silicide layer formed on the top of the polycrystalline silicon line contributes three times more to the conductance of the line than titanium silicide of equal thickness formed on each of the two sidewalls. As the digit line decreases in size to 0.5 microns wide, however, a titanium silicide layer formed on each of the 0.5 micron thick sidewalls contributes twice as much to the conductance than titanium silicide of equal thickness formed on the top of the poly line.

While this invention has been described with reference to illustrative embodiments, this description is not meant to be construed in a limiting sense. Various embodiments of the invention will be apparent to persons skilled in the art upon reference to this description. It is therefore contemplated that the appended claims will cover any such embodiments as fall within the scope of the claims.

We claim:

1. A structure for a semiconductor device, comprising:
   a) a semiconductor substrate having a major, substantially planar surface;
   b) a dielectric layer formed over said semiconductor substrate;
   c) a digit line comprising a layer of polycrystalline silicon formed over said dielectric layer, said polycrystalline silicon layer having a major surface substantially parallel with said substrate surface and a pair of minor surfaces intersecting said major surface of said polycrystalline silicon layer,
   said digit line further comprising a layer of conductive material comprising a refractory metal, said conductive material formed on said major and minor surfaces of said polycrystalline silicon layer,
   whereby said conductive material increases the conductive capacity of said digit line.

2. The structure of claim 1 wherein said minor surfaces are substantially parallel.

3. The structure of claim 1 wherein said minor surfaces are sloped and intersect said major surface to form an angle greater than 90°.

4. The structure of claim 1 wherein said conductive material formed on said major and minor surfaces is less than about 35% as thick as said polycrystalline silicon layer.

5. The structure of claim 1 wherein said polycrystalline silicon layer is less than about 5000 Å thick, and said conductive material is less than about 2000 Å thick.

6. The structure of claim 1 wherein said conductive material further comprises silicon.

7. The structure of claim 1 wherein said refractory metal is a metal selected from the group consisting of titanium, cobalt, tantalum, and tungsten.

8. The structure of claim 1 wherein said refractory metal is titanium.

9. A semiconductor die, comprising:
   a) a semiconductor substrate having a major, substantially planar surface;
   b) a dielectric layer formed over said semiconductor substrate;

c) a digit line comprising a layer of polycrystalline silicon formed over said dielectric layer, said polycrystalline silicon layer having a major surface substantially parallel with said substrate surface and a pair of minor surfaces intersecting said major surface of said polycrystalline silicon layer, said digit line further comprising a layer of conductive material comprising a refractory metal, said conductive material formed on said major and minor surfaces of said polycrystalline silicon layer, whereby said conductive material increases the conductive capacity of said digit line.

10. The semiconductor die of claim 9 wherein said minor surfaces are substantially parallel.

11. The semiconductor die of claim 9 wherein said minor surfaces are sloped and intersect said major surface to form an angle greater than 90°.

12. The semiconductor die of claim 9 wherein said conductive material formed on said major and minor surfaces is less than about 35% as thick as said polycrystalline silicon layer.

13. The semiconductor die of claim 9 wherein said polycrystalline silicon layer is less than 5000 Å thick, and said conductive material is less than 2000 Å thick.

14. The semiconductor die of claim 9 wherein said conductive material further comprises silicon.

15. The semiconductor die of claim 9 wherein said refractory metal is a metal selected from the group consisting of titanium, cobalt, tantalum, and tungsten.

16. The semiconductor die of claim 9 wherein said refractory metal is titanium.

* * * * *